(12) United States Patent
Baek

(10) Patent No.: US 8,990,030 B2
(45) Date of Patent: Mar. 24, 2015

(54) SUBMERSION DETECTION CIRCUIT AND SUBMERSION DETECTION APPARATUS USING THE SAME

(75) Inventor: Seongmun Baek, Anyang-si (KR)

(73) Assignee: LG Chem, Ltd., Seoul (KR)

( * ) Notice: Subject to any disclaimer, the term of this patent is extended or adjusted under 35 U.S.C. 154(b) by 452 days.

(21) Appl. No.: 13/448,841

(22) Filed: Apr. 17, 2012

(65) Prior Publication Data

US 2013/0073237 A1   Mar. 21, 2013

Related U.S. Application Data

(63) Continuation of application No. PCT/KR2012/001175, filed on Feb. 16, 2012.

(30) Foreign Application Priority Data

Sep. 21, 2011  (KR) .................. 10-2011-0095082
Feb. 16, 2012  (KR) .................. 10-2012-0015596

(51) Int. Cl.
   *G01F 23/24*      (2006.01)
   *G01M 3/16*       (2006.01)
   (Continued)

(52) U.S. Cl.
   CPC .............. *B60R 16/023* (2013.01); *G01F 23/24* (2013.01); *G01M 3/16* (2013.01); *G01D 21/00* (2013.01); *G01R 27/14* (2013.01); *G06F 19/00* (2013.01)
   USPC ............ 702/55; 73/45.5; 73/340 R; 73/865.8; 73/866.3; 324/716; 702/166; 702/189; 708/200

(58) Field of Classification Search
   CPC ...... B60R 16/00; B60R 16/02; B60R 16/023; B60R 99/00; G01D 1/00; G01D 7/00; G01D 9/00; G01D 21/00; G01F 23/00; G01F 23/0061; G01F 23/0084; G01F 23/22; G01F 23/24; G01F 23/26; G01R 27/00; G01R 27/08; G01R 27/14; G06F 11/00; G06F 11/32; G06F 11/34; G06F 15/00; G06F 15/16; G06F 17/00; G06F 17/10; G06F 17/40; G06F 19/00; G08B 3/00; G08B 5/00; G08B 5/22; G08B 5/36; G08B 7/00; G08B 7/06; G08B 21/00; G08B 21/18; G08B 21/20
   USPC .............. 73/1.01, 1.73, 37, 40, 45.5, 290 R, 73/304 R, 432.1, 865.8, 865.9, 866.3; 324/600, 649, 691, 713, 715, 716, 725; 702/1, 33, 50, 55, 57, 64, 127, 155, 702/166, 182, 187, 189; 708/100, 105, 200
   See application file for complete search history.

(56) References Cited

U.S. PATENT DOCUMENTS 3,778,797 A   12/1973  Killen
4,524,349 A   6/1985   Hyatt
4,939,511 A   7/1990   Hinckley

FOREIGN PATENT DOCUMENTS

CN   201532376 U         7/2010
GB      760668 A    *   11/1956
(Continued)

OTHER PUBLICATIONS

KIPO Notice of Preliminary Rejection for Appl. No. 10-2012-0015596 dated Feb. 15, 2013.
(Continued)

*Primary Examiner* — Edward Cosimano
(74) *Attorney, Agent, or Firm* — Birch, Stewart, Kolasch & Birch, LLP

(57) ABSTRACT

A submersion detection circuit includes a power source unit, a reference resistor connected between the power source unit and a voltage measurement node, a submersion unit configured to include a plurality of submersion measurement resistors connected in parallel to the voltage measurement node. Submersion contact terminals are formed at respective ends of the submersion measurement resistors, and a voltage measurement unit connected to the voltage measurement node and configured to measure voltage divided by the reference resistor and the submersion unit when the submersion contact terminals submerge.

15 Claims, 4 Drawing Sheets

(51) Int. Cl.
  *G01R 27/14* (2006.01)
  *G01D 21/00* (2006.01)
  *G06F 19/00* (2011.01)
  *B60R 16/023* (2006.01)

(56) References Cited

FOREIGN PATENT DOCUMENTS

| JP | 6-307968 A | 11/1994 |
| JP | 9-70894 A | 3/1997 |
| JP | 2002-188977 A | 7/2002 |
| JP | 2006-308422 A | 11/2006 |
| JP | 2007-218740 A | 8/2007 |
| KR | 10-2005-0115581 A | 12/2005 |
| KR | 10-0536524 B1 | 12/2005 |
| WO | WO 2009/115131 A1 | 9/2009 |

OTHER PUBLICATIONS

International Search Report, dated Sep. 25, 2012, for International Application No. PCT/KR2012/001175.

Written Opinion of the International Searching Authority and English translation, dated Sep. 25, 2012, for International Application No. PCT/KR2012/001175.

Chinese Office Action and English translation, dated Nov. 25, 2014, for Chinese Application No. 201280011906.2.

* cited by examiner

SUBMERSION DETECTION CIRCUIT AND SUBMERSION DETECTION APPARATUS USING THE SAME

CROSS-REFERENCE TO RELATED APPLICATIONS

This application is a Continuation of PCT International Application No. PCT/KR2012/001175 filed on Feb. 16, 2012, which claims the benefit of Patent Application No. 10-2011-0095082 filed in Korea on Sep. 21, 2011 and Patent Application No. 10-2012-0015596 filed in Korea on Feb. 16, 2012. The entire contents of all of the above applications is hereby incorporated by reference.

BACKGROUND OF THE INVENTION

1. Field of the Invention

The present invention relates to a submersion detection circuit and a submersion detection apparatus using the same and, more particularly, to a submersion detection circuit capable of checking a submersion position and a submersion detection apparatus using the same.

2. Discussion of the Related Art

Electrical and electronic equipments, machines, etc. may have their functions deteriorated or lost if they submerge. Accordingly, submerged electrical and electronic equipments, submerged machines, etc. require instant repair or replacement.

Particularly, if only some of the parts of equipment including a plurality of parts submerge, it is important to check the degree of submersion and the submersion position of the equipment in order to check whether to replace or repair the equipment.

Furthermore, in large-sized equipments, factories, etc. in addition to electrical and electronic equipments or machines, it is important to check the degree of submersion and the submersion position in order to maintain the equipment or facilities.

Korean Patent No. 536524 entitled 'A FLOODING SENSOR AND THE SYSTEM FOR WARNING OF FLOODING THEREOF' discloses a submersion detection apparatus for checking whether submersion has occurred or checking the level of submersion by using differential pressure sensors for detecting a pressure difference.

SUMMARY OF THE INVENTION

The present invention provides a submersion detection circuit and a submersion detection apparatus using a plurality of resistors which is electrified by submersion.

In order to achieve the above, a submersion detection circuit according to an aspect of the present invention includes a power source unit; a reference resistor connected between the power source unit and a voltage measurement node; a submersion unit configured to include a plurality of submersion measurement resistors connected in parallel to the voltage measurement node, wherein submersion contact terminals are formed at respective ends of the submersion measurement resistors; and a voltage measurement unit connected to the voltage measurement node and configured to measure voltage divided by the reference resistor and the submersion unit when the submersion contact terminals submerge.

Composite resistance values of one or more of the plurality of submersion measurement resistors may be different from each other.

The plurality of submersion measurement resistors may have different resistance values.

The plurality of submersion measurement resistors may have resistance value of different prime numbers.

The submersion contact terminals may be electrical wires extended from the respective submersion measurement resistors.

The voltage measurement unit may be an Analog to Digital Converter (ADC).

A submersion detection apparatus according to another aspect of the present invention includes a power source unit; a reference resistor configured to have one terminal connected to the power source unit and have the other terminal connected to a voltage measurement node; a submersion unit configured to include a plurality of submersion measurement resistors connected in parallel to the voltage measurement node and placed in respective submersion measurement positions; a voltage measurement unit connected to the voltage measurement node and configured to measure divided voltage values divided by the reference resistor and the submersion unit; and a processing unit connected to the voltage measurement unit and configured to determine whether submersion has occurred and submersion measurement positions based on the divided voltage values.

Submersion contact terminals are included at respective ends of the plurality of submersion measurement resistors, and the plurality of submersion measurement resistors are electrified when the submersion contact terminals submerge.

Composite resistance values by combinations of the plurality of submersion measurement resistors may be different from each other.

The processing unit may include a data storage unit for storing the divided voltage values according to the respective composite resistance values.

The data storage unit may further store the submersion measurement positions which correspond to the respective divided voltage values and where the respective submersion measurement resistors are placed.

The processing unit determines whether submersion has occurred and the submersion measurement positions by comparing the divided voltage values, measured by the voltage measurement unit, with the respective divided voltage values stored in the data storage unit.

The processing unit may include a data storage unit for storing the composite resistance values.

The data storage unit may further store the submersion measurement positions which correspond to the respective composite resistance values and where the respective submersion measurement resistors are placed, in association with the composite resistance values.

The processing unit further may include a reverse composite resistance value calculation unit for calculating reverse composite resistance values of the submersion unit based on the divided voltage values, a supply voltage of the power source unit, and a resistance value of the reference resistor.

The processing unit determines whether submersion has occurred and the submersion measurement positions by comparing the reverse composite resistance values of the reverse composite resistance value calculation unit with the respective composite resistance values stored in the data storage unit.

The submersion detection apparatus may further include a display unit for displaying whether submersion has occurred and the submersion measurement positions by the processing unit.

DESCRIPTION OF EXEMPLARY EMBODIMENTS

Figure 1:
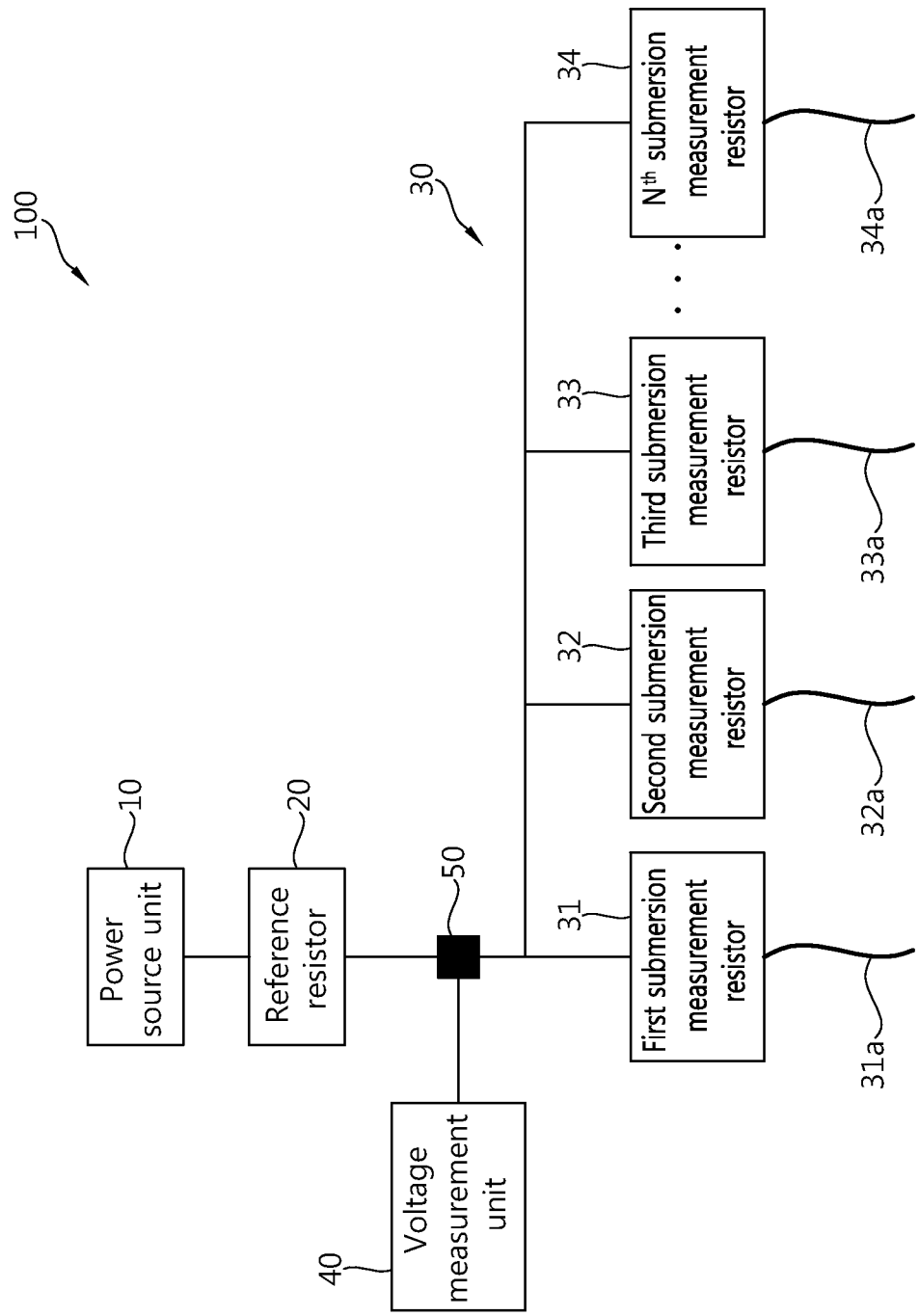
FIG. 1 is a block diagram of a submersion detection circuit according to an embodiment of the present invention.

Hereinafter, some embodiments of the present invention will be described in detail with reference to the accompanying drawings. However, the present invention is not limited to the disclosed embodiments, but may be implemented in various ways. The present embodiments are provided to complete the disclosure of the present invention and to allow those having ordinary skill in the art to understand the scope of the present invention. The shapes, etc., of elements in the drawings may be enlarged in order to highlight a clearer description. The same reference numbers are used throughout the drawings to refer to the same parts.

FIG. 1 is a block diagram of a submersion detection circuit according to an embodiment of the present invention.

As shown in FIG. 1, the submersion detection circuit 100 according to the embodiment of the present invention includes a power source unit 10, a reference resistor 20, a submersion unit 30, and a voltage measurement unit 40.

The power source unit 10 is an electrical source for supplying voltage to the submersion detection circuit 100.

The driving source of an apparatus or equipment on which the submersion detection circuit 100 is mounted may be used as the power source unit 10. Alternatively, the power source unit 10 may be a power source additionally included in the submersion detection circuit 100.

The power source unit 10 may be connected to one terminal of the reference resistor 20. Furthermore, the other terminal of the reference resistor 20 may be connected to the submersion unit 30.

The submersion unit 30 includes a plurality of first to $N^{th}$ submersion measurement resistors 31 to 34 connected in parallel.

Each of the first to $N^{th}$ submersion measurement resistors 31 to 34 may be formed of a resistor having a different impedance.

Furthermore, composite resistance values according to all the combinations of one or more of the first to $N^{th}$ submersion measurement resistors 31 to 34 may be different.

For example, in order for the composite resistance values to be different, the impedance of each of the first to $N^{th}$ submersion measurement resistors 31 to 34 may have a different prime number. For example, resistance values of N different prime numbers may be selected in such a manner that the first submersion measurement resistor 31 has 3 KΩ, the second submersion measurement resistor 32 has 5 KΩ, the third submersion measurement resistor 33 has 7 KΩ, a fourth submersion measurement resistor (not shown) has 11 KΩ, etc.

Meanwhile, submersion contact terminals 31a to 34a may be provided at the respective ends of the first to $N^{th}$ submersion measurement resistors 31 to 34.

The submersion contact terminals 31a to 34a are parts coming in contact with water when submersion occurs. When the submersion contact terminals 31a to 34a submerge, the first to $N^{th}$ submersion measurement resistors 31 to 34, the reference resistor 20, and the power source unit 10 form a closed circuit.

The submersion contact terminals 31a to 34a may be made of conductive material and may be electrical wires extended from the first to $N^{th}$ submersion measurement resistors 31 to 34.

Accordingly, of some of the submersion contact terminals 31a to 34a submerge, submersion measurement resistors connected to the submerged submersion contact terminals are electrified, but submersion measurement resistors connected to submersion contact terminals not submerged are not electrified.

Meanwhile, the voltage measurement unit 40 is connected to a point 50 (hereinafter referred to as a voltage measurement node) at which the reference resistor 20 and the submersion unit 30 are connected together. Thus, voltage at the voltage measurement node 50 can be measured.

If submersion does not occur, voltage supplied by the power source unit 10 is supplied to only the reference resistor 20 because current does not flow through the submersion unit 30.

If some or all of the submersion contact terminals 31a to 34a submerge, however, current passing through the reference resistor 20 flows into submersion measurement resistors connected to the submerged submersion contact terminals, and voltage supplied by the power source unit 10 is divided into the reference resistor 20 and the relevant submersion measurement resistors.

Accordingly, whether submersion has occurred can be checked on the basis of voltage at the voltage measurement node 50 which is measured by the voltage measurement unit 40.

Furthermore, the impedances of the first to $N^{th}$ submersion measurement resistors 31 to 34 are selected so that the composite resistance values according to the combinations of the first to $N^{th}$ submersion measurement resistors 31 to 34 are different as described above. Thus, the voltage measurement node 50 has a different voltage value depending on a submersion position. Accordingly, even a submerged submersion position can be determined by checking only the voltage of the voltage measurement node 50 which is measured by the voltage measurement unit 40.

For example, assuming that the power source unit 10 supplies DC voltage of 5 V, the reference resistor 20 has 5 KΩ, the first submersion measurement resistor 31 has 3 KΩ, the second submersion measurement resistor 32 has 5 KΩ, and the third submersion measurement resistor 33 has 7 KΩ, 1) if only the submersion contact terminal 31a connected to the first submersion measurement resistor 31 submerges, voltage measured by the voltage measurement unit 40 is $5*\{3/(3+5)\}=1.875$ V, 2) if only the submersion contact terminal 32a connected to the second submersion measurement resistor 32 submerges, voltage measured by the voltage measurement unit 40 is $5*\{5/(5+5)\}=2.5$ V, 3) if only the submersion contact terminal 33a connected to the third submersion measurement resistor 33 submerges, voltage measured by the voltage measurement unit 40 is $5*\{7/(7+5)\}=2.917$ V, 4) if only the submersion contact terminal 31a connected to the first submersion measurement resistor 31 and the submersion contact terminal 32a connected to the second submersion measurement resistor 32 submerge, voltage measured by the voltage measurement unit 40 is $5*\{(\frac{1}{3}+\frac{1}{5})/(5+\frac{1}{3}+\frac{1}{5})\}=0.482$ V, 5) if only the submersion contact terminal 31a connected to the first submersion measurement resistor 31 and the submersion contact terminal 33a connected to the third submersion measurement resistor 33 submerge, voltage measured by the voltage measurement unit 40 is $5*\{(\frac{1}{3}+\frac{1}{7})/(5+\frac{1}{3}+\frac{1}{7})\}=0.4348$ V, 6) if only the submersion contact terminal 32a connected to the second submersion measurement resistor 32 and the submersion contact terminal 33a connected to the third submersion measurement resistor 33 submerge, voltage measured by the voltage measurement unit 40 is $5*\{(\frac{1}{5}+\frac{1}{7})/(5+\frac{1}{5}+\frac{1}{7})\}=0.3208$ V, and 7) if only the submersion contact terminal 31a connected to the first submersion measurement resistor 31, the submersion contact terminal 32a connected to the second submersion measurement resistor 32, and the submersion contact terminal 33a connected to the third submersion measurement resistor 33 submerge, voltage measured by the voltage measurement unit 40 is $5*\{(\frac{1}{3}+\frac{1}{5}+\frac{1}{7})/(5+\frac{1}{3}+\frac{1}{5}+\frac{1}{7})\}=0.5956$ V.

As in the above example, voltage measured by the voltage measurement unit 40 is different depending on a submersion position. Accordingly, a submersion position can be checked on the basis of the measured voltage. In other words, if voltage measured by the voltage measurement unit 40 is 2.5 V, it can be seen that only a position where the second submersion measurement resistor 32 is placed has submerge. If voltage measured by the voltage measurement unit 40 is 1.141 V, it can be seen that only positions where the first submersion measurement resistor 31, the second submersion measurement resistor 32, and the third submersion measurement resistor 33 have submerged.

An Analog to Digital Converter (ADC) for converting the voltage value (i.e., an analog value) of the voltage measurement node 50 into a digital value may be used as the voltage measurement unit 40.

The submersion detection circuit 100 according to the embodiment of the present invention includes the first to $N^{th}$ submersion measurement resistors 31 to 34 equipped with the respective submersion contact terminals 31a to 34a instead of the conventional differential pressure sensors or floating sensors in order to check submersion. Accordingly, whether submersion has occurred and a submersion position can be checked, and a circuit can be configured at a low price.

Furthermore, if additional submersion measurement resistors are connected in parallel to the first to $N^{th}$ submersion measurement resistors 31 to 34, the number of places where the occurrence of submersion is measured can be increased. Here, the circuits can be easily extended and installed.

A submersion detection apparatus according to an embodiment of the present invention is described below.

Figure 2:
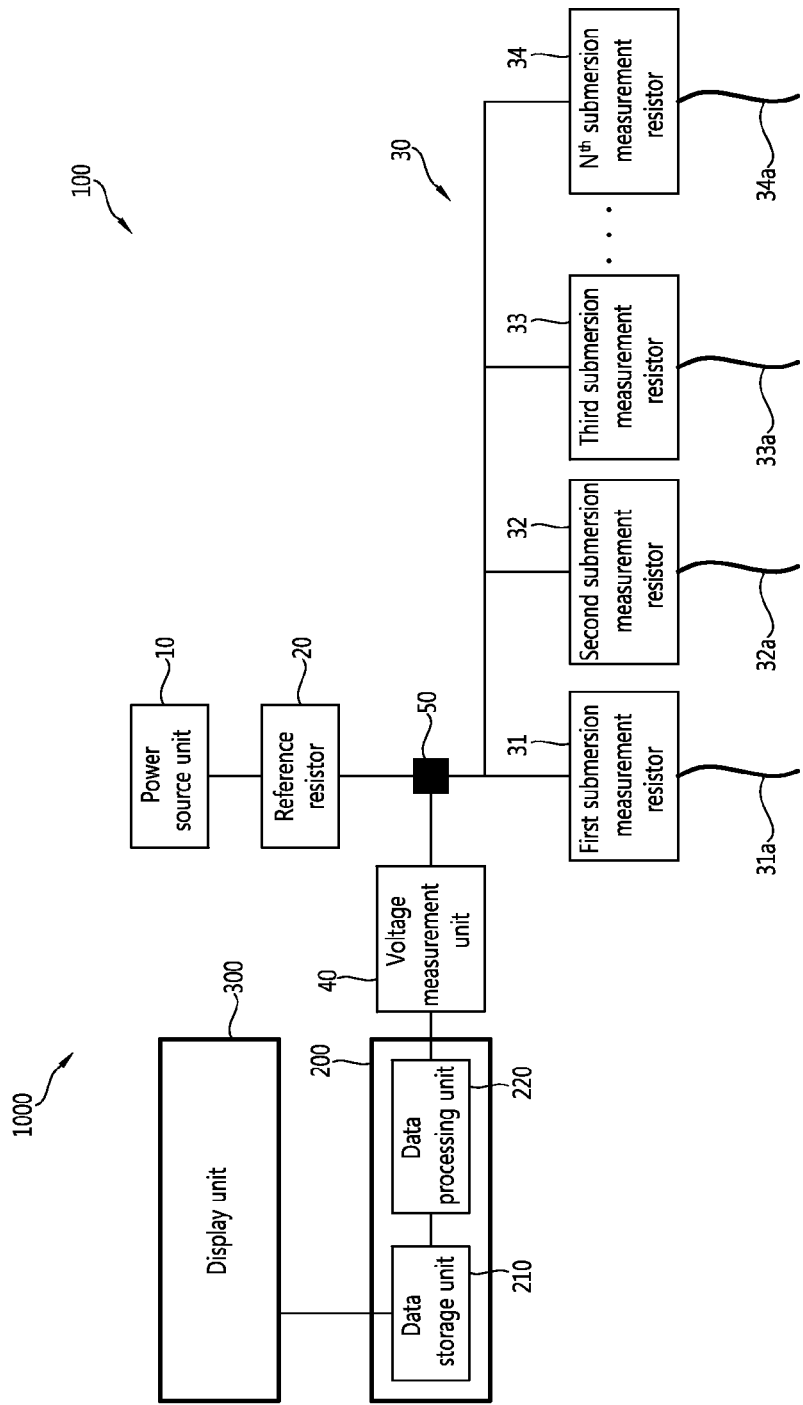
FIG. 2 is a block diagram of a submersion detection apparatus according to an embodiment of the present invention.

FIG. 2 is a block diagram of the submersion detection apparatus including the submersion detection circuit 100 according to the embodiment of the present invention.

As shown in FIG. 2, the submersion detection apparatus 1000 according to the embodiment of the present invention includes the submersion detection circuit 100, a processing unit 200, and a display unit 300.

The submersion detection circuit 100 has been described above and a description thereof is omitted.

The processing unit 200 may include a data storage unit 210 and a data processing unit 220.

The data storage unit 210 may store the divided voltage values of the voltage measurement node 50 according to the composite resistance values by the combinations of the first to $N^{th}$ submersion measurement resistors 31 to 34.

The divided voltage values may be previously calculated on the basis of the composite resistance values, the resistance value of the reference resistor 20, and the supply voltage value of the power source unit 10 and then stored in the data storage unit 210.

The data storage unit 210 may store pieces of position information about the first to $N^{th}$ submersion measurement resistors 31 to 34 corresponding to the respective divided voltage values in association with the respective divided voltage values. For example, a divided voltage value when the submersion contact terminal 31a of the first submersion measurement resistor 31 submerges may be recorded in association with the first submersion measurement resistor 31, a divided voltage value when the submersion contact terminal 32a of the second submersion measurement resistor 32 submerges may be recorded in association with the second submersion measurement resistor 32, and a divided voltage value when the submersion contact terminals 31a and 32a of the first and the second submersion measurement resistors 31 and 32 submerge may be recorded in association with the first submersion measurement resistor 31 and the second submersion measurement resistor 32. In case of other combinations of the first to $N^{th}$ submersion measurement resistors 31 to 34, a divided voltage value may be recorded likewise.

The data processing unit 220 receives the divided voltage values measured by the voltage measurement unit 40 and compares the divided voltage values with the respective divided voltage values stored in the data storage unit 210.

The data processing unit 220 may extract a divided voltage value equal to the divided voltage measured by the voltage measurement unit 40 or falling within a specific tolerance, from among the divided voltage values, and check information about the first to $N^{th}$ submersion measurement resistors 31 to 34 associated with the relevant divided voltage value.

In an alternative embodiment, the composite resistance values by the combinations of the first to $N^{th}$ submersion measurement resistors 31 to 34 instead of the divided voltage values may be stored in the data storage unit 210. Furthermore, the pieces of position information about the first to $N^{th}$ submersion measurement resistors 31 to 34, corresponding to the respective composite resistance values, may be stored in association with the respective composite resistance values.

The data processing unit 220 may receive the divided voltage values measured by the voltage measurement unit 40 and calculate the composite resistance values of the submersion unit 30 on the basis of the supply voltage value of the power source unit 10 and the resistance value of the reference resistor 20.

In this case, the supply voltage value of the power source unit 10 may be previously stored, or the voltage value of the output terminal of the power source unit 10 may be detected in real time and used. It is preferred that previously stored data be used as the resistance value of the reference resistor 20 in order to improve the data processing speed and to simplify the apparatus.

The data processing unit 220 may compare the calculated composite resistance values with the respective composite resistance values stored in the data storage unit 210, extract a composite resistance value equal to the stored composite resistance value or falling within a specific tolerance, from among the calculated composite resistance values, and check information about the first to $N^{th}$ submersion measurement resistors 31 to 34 associated with the relevant composite resistance value.

This construction may be used to detect the voltage value of the output terminal of the power source unit 10 in real time and to use the detected voltage value in an operation. Accordingly, the construction may be applied to a variety of equipments using different voltages when the power source of equipment including the circuit is used as the power source unit 10.

The processing unit 200 constructed as above can check whether submersion has occurred and check submersion positions at which the first to $N^{th}$ submersion measurement resistors 31 to 34 are placed on the basis of information about the first to $N^{th}$ submersion measurement resistors 31 to 34.

The display unit 300 may be connected to the processing unit 200 and configured to visually inform a user of whether submersion has occurred and of a submersion position.

A display device may be used as the display unit 300. Positions where the first to $N^{th}$ submersion measurement resistors 31 to 34 are placed may be displayed on a screen of the display device and, at the same time, a position where a submerged submersion measurement resistor is placed may be displayed on a screen of the display device.

In an alternative embodiment, a plurality of flickering lamps may be used as the display unit 300. Only lamps displaying positions where submerged submersion measurement resistors are placed, from among the plurality of flickering lamps, may be flickered.

The display unit 300 may display a submersion position and simultaneously generate an alarm to a user when submersion is detected.

Figure 3:
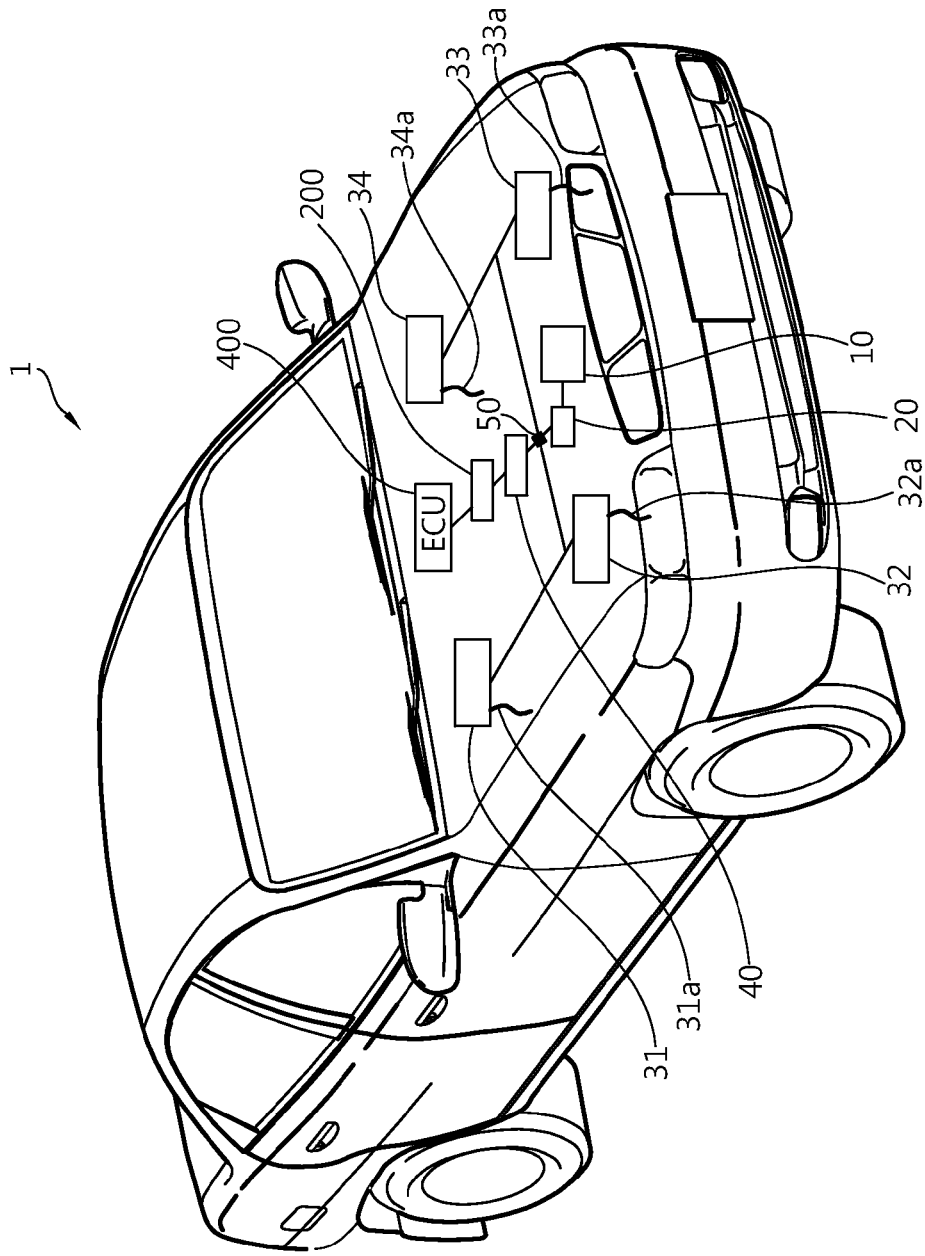
FIG. 3 is a diagram illustrating an example in which the submersion detection apparatus according to the embodiment of the present invention is applied to a vehicle.

Examples in which the submersion detection apparatus according to the embodiment of the present invention is applied are described below. FIG. 3 is a diagram illustrating an example in which the submersion detection apparatus according to the embodiment of the present invention is applied to a vehicle.

As shown in FIG. 3, the first to $N^{th}$ submersion measurement resistors 31 to 34 may be installed in the respective elements of a vehicle 1. The first to $N^{th}$ submersion measurement resistors 31 to 34 are connected in parallel. Furthermore, the submersion contact terminals 31a to 34a may be included in the respective ends of the first to $N^{th}$ submersion measurement resistors 31 to 34.

The submersion unit 30, including the first to $N^{th}$ submersion measurement resistors 31 to 34 and the submersion contact terminals 31a to 34a, is connected to the reference resistor 20. The voltage measurement node 50 is formed at the position where the submersion unit 30 and the reference resistor 20 are connected together.

The voltage measurement unit 40 is connected to the voltage measurement node 50. An Analog to Digital Converter (ADC) may be used as the voltage measurement unit 40.

The reference resistor 20 is connected to the power source unit 10. The power source unit 10 may be a vehicle battery embedded in the vehicle 1 or may be an electric charging source separately provided.

The processing unit 200 may be connected to the voltage measurement unit 40 and configured to check whether the elements of the vehicle 1 in which the first to $N^{th}$ submersion measurement resistors 31 to 34 are installed have submerged. The construction of the processing unit 200 has been described above, and a description thereof is omitted.

The processing unit 200 may be included in an Electronic Control Unit (ECU) 400 embedded in the vehicle 1.

Information about the elements of the vehicle 1 whose submersion has been checked by the processing unit 200 is stored in the ECU 400. When a diagnosis device (not shown) for checking the vehicle is connected to the ECU 400, relevant submersion information is displayed in the diagnosis device so that the subject of repair according to the submersion can be checked.

Whether a vehicle has submerged and a submerged part of the vehicle can be easily checked through the above construction.

The submersion detection apparatus according to the embodiment of the present invention may also be applied to a variety of large-sized machines and electronic equipments in addition to the vehicle.

Figure 4:
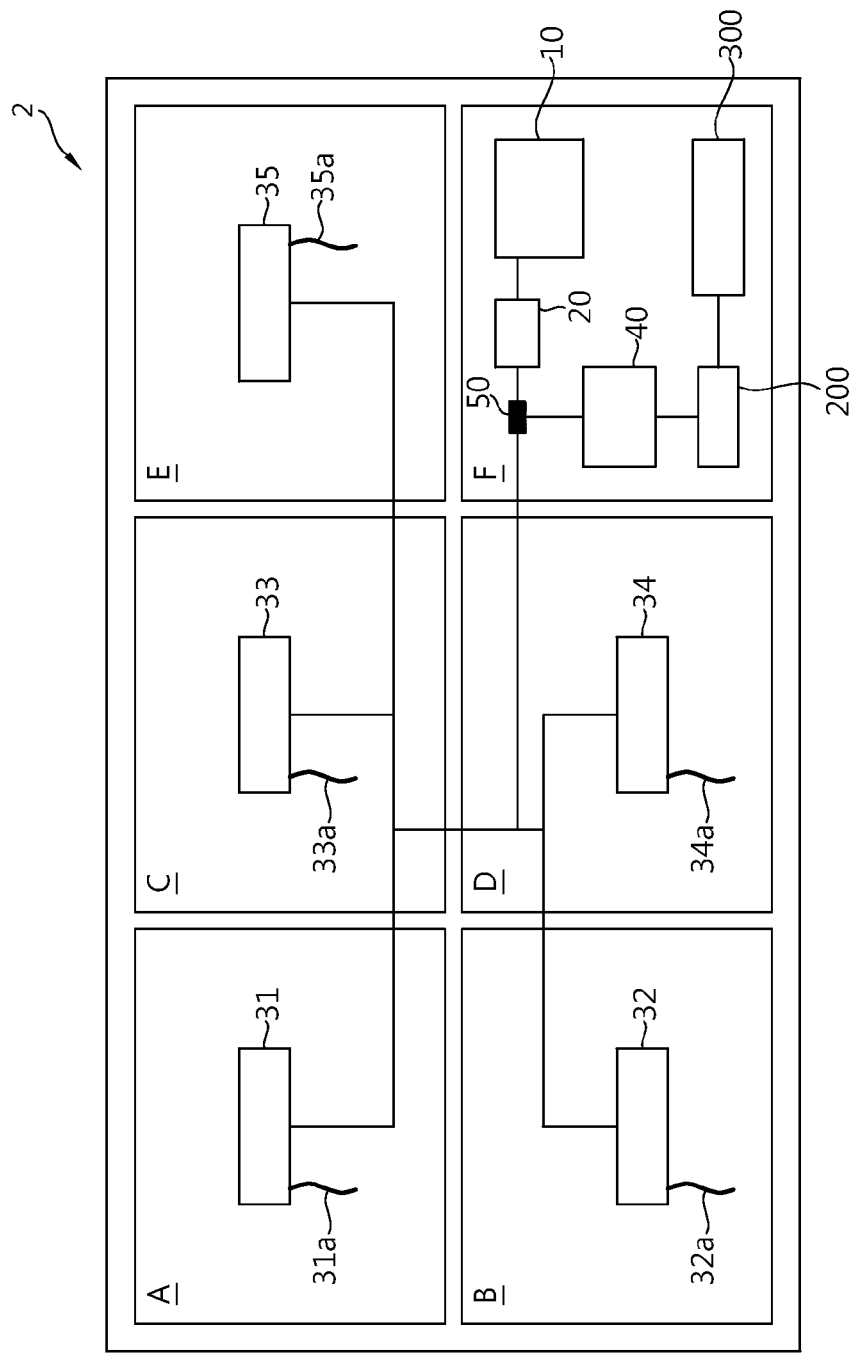
FIG. 4 is a diagram illustrating an example in which the submersion detection apparatus according to the embodiment of the present invention is applied to a factory.

FIG. 4 is a diagram illustrating an example in which the submersion detection apparatus according to the embodiment of the present invention is applied to a factory.

As shown in FIG. 4, the submersion measurement resistors 31 to 35 may be installed in the respective sections A to E of the factory 2. The submersion measurement resistors 31 to 35 are connected in parallel. Furthermore, the submersion contact terminals 31a to 35a may be provided at the respective ends of the submersion measurement resistors 31 to 35.

The submersion unit 30, including the submersion measurement resistors 31 to 35 and the submersion contact terminals 31a to 35a, is connected to the reference resistor 20. The voltage measurement node 50 is formed at a portion at which the submersion unit 30 and the reference resistor 20 are connected together.

The voltage measurement unit 40 is connected to the voltage measurement node 50. An Analog to Digital Converter (ADC) may be used as the voltage measurement unit 40.

The reference resistor 20 is connected to the power source unit 10.

The processing unit 200 may be connected to the voltage measurement unit 40 and configured to check whether submersion has occurred in each of the sections A to E of the factory 2 in which the submersion measurement resistors 31 to 34 are installed. The construction of the processing unit 200 has been described, and a description thereof is omitted.

The display unit 300 connected to the processing unit 200 may be provided in a control room F in which the entire factory 2 is managed controlled and configured to display submersion occurring in each of the sections A to E of the factory 2 in which the submersion measurement resistors 31 to 34 are installed. As described above, the display device or the plurality of flickering lamps may be used as the display unit 300.

Whether submersion has occurred in a factory and a submersion section can be easily checked through the construction. Furthermore, the present invention may also be applied buildings, large-sized equipments, etc. using a similar construction.

The submersion detection circuit and the submersion detection apparatus according to the present invention can check whether submersion has occurred and a submersion position.

Furthermore, a circuit can be configured at a low price, the circuit can be easily installed, and the number of places whose submersion is measured can be easily increased.

The embodiments of the present invention described above and shown in the drawings should not be construed as limiting the technical spirit of the present invention. The scope of the present invention is restricted by only the claims, and a person having ordinary skill in the art to which the present invention pertains may improve and modify the technical spirit of the present invention in various forms. Accordingly, the modifications and modifications will fall within the scope of the present invention as long as they are evident to those skilled in the art.

What is claimed is:

1. A submersion detection circuit, comprising
a power source unit;
a reference resistor connected between the power source unit and a voltage measurement node;
a submersion unit configured to include a plurality of submersion measurement resistors connected in parallel to the voltage measurement node, wherein submersion contact terminals are formed at respective ends of the submersion measurement resistors; and a voltage measurement unit connected to the voltage measurement node and configured to measure voltage divided by the reference resistor and the submersion unit when the submersion contact terminals submerge, wherein composite resistance values of one or more of the plurality of submersion measurement resistors are different from each other.

2. The submersion detection circuit as claimed in claim 1, wherein the plurality of submersion measurement resistors has different resistance values.

3. The submersion detection circuit as claimed in claim 1, wherein the plurality of submersion measurement resistors has resistance value of different prime numbers.

4. The submersion detection circuit as claimed in claim 1, wherein the submersion contact terminals are electrical wires extended from the respective submersion measurement resistors.

5. The submersion detection circuit as claimed in claim 1, wherein the voltage measurement unit is an Analog to Digital Converter (ADC).

6. A submersion detection apparatus, comprising:
a power source unit;
a reference resistor configured to have one terminal connected to the power source unit and have the other terminal connected to a voltage measurement node;
a submersion unit configured to include a plurality of submersion measurement resistors connected in parallel to the voltage measurement node and placed in respective submersion measurement positions;
a voltage measurement unit connected to the voltage measurement node and configured to measure divided voltage values divided by the reference resistor and the submersion unit; and
a processing unit connected to the voltage measurement unit and configured to determine whether submersion has occurred and submersion measurement positions based on the divided voltage values,
wherein composite resistance values by combinations of the plurality of submersion measurement resistors are different from each other.

7. The submersion detection apparatus as claimed in claim 6, wherein:
submersion contact terminals are included at respective ends of the plurality of submersion measurement resistors, and the plurality of submersion measurement resistors is electrified when the submersion contact terminals submerge.

8. The submersion detection apparatus as claimed in claim 6, further comprising a display unit for displaying whether submersion has occurred and the submersion measurement positions by the processing unit.

9. The submersion detection apparatus as claimed in claim 6, wherein the processing unit comprises a data storage unit for storing the divided voltage values according to the respective composite resistance values.

10. The submersion detection apparatus as claimed in claim 9, wherein the data storage unit further stores the submersion measurement positions which correspond to the respective divided voltage values and where the respective submersion measurement resistors are placed.

11. The submersion detection apparatus as claimed in claim 9, wherein the processing unit determines whether submersion has occurred and the submersion measurement positions by comparing the divided voltage values, measured by the voltage measurement unit, with the respective divided voltage values stored in the data storage unit.

12. The submersion detection apparatus as claimed in claim 6, wherein the processing unit comprises a data storage unit for storing the composite resistance values.

13. The submersion detection apparatus as claimed in claim 12, wherein the data storage unit further stores the submersion measurement positions which correspond to the respective composite resistance values and where the respective submersion measurement resistors are placed, in association with the composite resistance values.

14. The submersion detection apparatus as claimed in claim 12, wherein the processing unit further comprises a reverse composite resistance value calculation unit for calculating reverse composite resistance values of the submersion unit based on the divided voltage values, a supply voltage of the power source unit, and a resistance value of the reference resistor.

15. The submersion detection apparatus as claimed in claim 14, wherein
the processing unit determines whether submersion has occurred and the submersion measurement positions by comparing the reverse composite resistance values of the reverse composite resistance value calculation unit with the respective composite resistance values stored in the data storage unit.

* * * * *